(12) United States Patent
Itoh

(10) Patent No.: US 6,233,297 B1
(45) Date of Patent: May 15, 2001

(54) PLESIOCHRONOUS DIGITAL HIERARCHY LOW SPEED SIGNAL SWITCHING DIGITAL PHASE-LOCKED LOOP SYSTEM

(75) Inventor: Masaaki Itoh, Tokyo (JP)

(73) Assignee: NEC Coporation, Tokyo (JP)

( * ) Notice: Subject to any disclaimer, the term of this patent is extended or adjusted under 35 U.S.C. 154(b) by 0 days.

(21) Appl. No.: 09/074,940

(22) Filed: May 8, 1998

(30) Foreign Application Priority Data

May 9, 1997 (JP) ..................................... 9-135966

(51) Int. Cl.[7] ............................... H03D 3/24; H03L 7/06; H03L 7/00
(52) U.S. Cl. ........................... 375/376; 331/1 R; 331/18; 327/156
(58) Field of Search ..................................... 375/376, 327, 375/215, 294; 331/34, 18, 25, 1 R, 1 A; 327/147, 150, 156, 159, 144, 145, 151, 160; 455/260; 713/400, 500, 501, 502

(56) References Cited

U.S. PATENT DOCUMENTS 5,604,774 * 2/1997 Rokugo et al. ...................... 375/376
5,715,286 * 2/1998 Itoh et al. ............................ 375/376

* cited by examiner

*Primary Examiner*—Stephen Chin
*Assistant Examiner*—Betsy L. Deppe
(74) *Attorney, Agent, or Firm*—Scully, Scott, Murphy & Presser

(57) ABSTRACT

A destuff circuit using a complete secondary system DPLL enables a DPLL circuit applicable to PDH low speed signal interface unit of a transmission communication apparatus to be shared. A switching signal from a selector causes a primary random walk filter, a secondary random walk filter, and counter number of a Q counter to be changed, and also causes the rate length of a rate multiplier to be changed, thereby providing a required DPLL circuit for a respective PDH low speed signal interface.

4 Claims, 2 Drawing Sheets

PLESIOCHRONOUS DIGITAL HIERARCHY LOW SPEED SIGNAL SWITCHING DIGITAL PHASE-LOCKED LOOP SYSTEM

BACKGROUND OF THE INVENTION

The present invention relates to a reception destuff circuit for use in an SDH (Synchronous Digital Hierarchy) network. More particularly, this invention relates to a complete secondary DPLL (Digital Phase Locked Loop) for use in stuff-synchronizing in an SDH network.

DESCRIPTION OF THE RELATED ART

In an SDH (Synchronous Digital Hierarchy) network, for frequency regulation for a high speed side clock, a pointer operation which uses byte stuffing has been adopted. Namely, a stuff pulse is stuffed on a data transmitting side, and the stuffed pulse is destuffed on a data receiving side. The transmitted data is temporarily memorized in a memory on the data receiving side, and is then read out by the low-speed side signal on the data receiving side.

In the pointer operation, a phase difference or error may occur as a result of the byte stuffing. Phase differences of 8 [UI/time] can be generated in every pointer operation. To obtain a low-speed side clock signal from a high-speed side clock signal, the phase caused by the pointer operation, i.e., stuffing and destuffing of the stuff pulse, should be minimized. Thus, the low-side clock signal in which the phase difference is minimized is used to read out data from the memory. Namely, in order to obtain a low speed side clock signal from a high speed side clock signal, it is necessary to provide a destuff circuit for minimizing a phase difference generated due to a pointer operation, namely insertion or elimination of a stuff pulse.

Generally, a PLL (Phase Locked Loop) is used for the destuff circuit. However, when the signal with a phase difference is input to the PLL (Phase Locked Loop), at the time of phase comparison with a signal which does not have a phase difference at the output side, a phase error occurs. Namely, in general, when data is read out from the memory, the destuff circuit using the PLL (phase-locked loop) has been used. However, when a signal with a phase difference is input to the PLL, a phase error occurs when comparing it with an output signal with no phase difference.

There is a destuff circuit adopting a complete secondary system DPLL for decreasing the phase error.

FIG. 1 is a view showing a constitution of the conventional destuff circuit adopting a complete secondary system DPLL. Referring to FIG. 1, the destuff circuit adopting a complete secondary system DPLL comprises a primary loop which includes a frequency regulator 1 for regulating a frequency by increasing or decreasing a pulse or pulses to or fro a reference clock signal, an R frequency divider 2 for dividing the frequency of the frequency-regulated reference clock by R to output a low-speed side clock signal, N frequency dividers 3-1 and 3-2 for dividing by N the frequencies of a high-speed side clock signal and the low-speed side clock signal, a multi-valued phase comparator 4 for comparing the phases output from the N frequency dividers 3-1 and 3-2 to output a leading phase pulse which represents the number of phase leads accumulating to a phase difference of 180° and a lagging phase pulse which represents the number of phase lags accumulating to a phase difference of 180°, a primary random walk filter 5 for dividing by N1 the difference between pulse numbers of the leading phase and the lagging phase output from the multi-valued phase comparator 4, and an adder-subtractor circuit 9 for providing the frequency regulator 1 with a control pulse.

In addition, the complete secondary system DPLL further comprises a secondary loop which includes a secondary random walk filter 6 for dividing by N2 the pulse number output from the primary random walk filter 5, a Q counter 7 for storing the output of the secondary random walk filter 6, a rate multiplier 8 for producing increment pulses or decrement pulses according to the low-speed side clock signal and a central frequency of the system, thus outputting selected increment and decrement pulses according to the values stored in the Q counter 7, and the adder-subtractor circuit 9 for increasing or decreasing the output of the primary random walk filter 5 according to the output of the rate multiplier 8 to provide the frequency regulator 1 with a control pulse for increasing or decreasing the frequency of regulator 1.

In the conventional destuff circuit adopting a complete secondary system DPLL, the secondary loop causes the low-speed side clock signal to operate at the central frequency of the system which is stored therein. The destuff circuit as described-above does not generate a steady-state phase error during operation at the stored central frequency of the system.

Namely, the steady-state phase error is generated because, when the frequency of the high-speed side clock signal is shifted to the frequency of the reference clock signal of the PLL, the steady-state phase error causes the PLL to lock to the frequency of the high-speed side clock signal. The steady-state phase error is generated when the primary loop causes the control pulse to be applied to the frequency regulator 1. However, the steady-state phase error is not generated due to the control pulse of the primary loop because the secondary loop applied the control pulse to the frequency regulator 1 during operation at the stored central frequency of the system.

However, there are problems in that the development costs spent for respective interface units, the time scheduled for development, and so forth are increased because the DPLL circuit is incapable of being used in common with each other, since it is necessary to design the DPLL circuit separately for 2M (megahertz) and for 1.5M (megahertz), in the interface unit providing a 2M interface and a 1.5M interface of the transmission communication apparatus for the destuff circuit adopting a conventional complete secondary system DPLL.

SUMMARY OF THE INVENTION

In view of the foregoing, it is an object of the invention to provide a PDH (Plesiochronous Digital Hierarchy) low-speed signal switching DPLL (Digital Phase-Locked Loop) system, in which it is unnecessary to design the DPLL circuit individually for respective different frequency interface units, in a destuff circuit adopting a complete secondary system DPLL which is applicable to a PDH low-speed signal interface unit of the transmission communication apparatus.

In one arrangement described below by way of example in illustration of the invention, a PDH low-speed signal switching DPLL system, which is a destuff circuit using a complete secondary system DPLL comprising a primary loop which includes a frequency regulator for regulating the frequency so as to add or eliminate a pulse(s) to or from a reference clock signal, an R frequency divider for outputting a low speed side clock signal by dividing by R the reference clock signal being subjected to frequency regulation, first and a second N frequency dividers for dividing by N a high speed side clock signal and a low speed side clock signal respectively, a multi-valued phase comparator for comparing the phases output from the first and the second N frequency dividers to output a leading phase pulse which represents the number of phase leads accumulating to a phase difference of 180° and a lagging phase pulse which represents the number of phase lags accumulating to a phase difference of 180°, a primary random walk filter for dividing by N1 the difference between pulse numbers of the leading phase and lagging phase outputs from the multi-valued phase comparator, and an adder-subtractor circuit for providing the frequency regulator with a control pulse, and in addition thereto a PDH low-speed signal switching DPLL system, which is a destuff circuit using a complete secondary DPLL system comprising a secondary loop which includes a secondary random walk filter for dividing by N2 a pulse number output from the primary random walk filter, a Q counter for storing an output of the secondary random walk filter, a rate multiplier for producing some increment pulses or decrement pulses according to the low-speed side clock signal and selecting an increment pulse or a decrement pulse corresponding to a stored central frequency of the system, thus outputting a selected pulse according to the value written in the Q counter, and the adder-subtractor for increasing or decreasing the output of the primary random walk filter according to the output of the rate multiplier, to provide the frequency regulator with a control pulse, wherein the destuff circuit includes a selector which implements changes of counter value N1 of the primary random walk filter, counter value N2 of the secondary random walk filter, counter stage numbers of the Q counter, and a change of rate length of the rate multiplier, pursuant to the signal which implements switching of DPLL parameters for respective PDH signals.

In one particular arrangement to be described in illustration of the present invention, by way of example, a PDH low speed signal switching system DPLL which is a destuff circuit using a compete secondary system DPLL comprises a primary loop including a frequency regulator for regulating frequency so as to add or eliminate a pulse(s) to or from a reference clock signal, an R frequency divider for outputting a low speed side clock signal while dividing by R the reference clock signal being subjected to frequency regulation, first and a second N frequency dividers for dividing by N a high speed side clock signal and a low speed side clock signal respectively, a multi-valued phase comparator for comparing the phases output from the first and the second N frequency dividers to output a leading phase pulse which represents the number of phase leads accumulating to a phase difference of 180° and a lagging phase pulse which represents the number of phase lags accumulating to a phase difference of 180°, a primary random walk filter for dividing by N1 the difference between the pulse numbers of the leading phase and lagging phase outputs from the multi-valued phase comparator, and an adder-subtractor circuit for providing the frequency regulator with a control pulse, a PDH low speed signal switching DPLL system which is a destuff circuit using a complete secondary DPLL system comprises a secondary loop including a secondary random walk filter for performing an up-count/down-count of increment pulses/decrement pulses which are output from the primary random walk filter, and to divide by N2 a difference of the respective count numbers, a Q counter for counting the increment pulses/decrement pulses which are output of the secondary random walk filter, a rate multiplier for producing some increment pulses or decrement pulses according to the low-speed side clock signal and a stored central frequency of the system, and outputting the selected pulse according to the values written in the Q counter, and the adder-subtractor for increasing or decreasing the output of the primary random walk filter according to the output of the rate multiplier to provide the frequency regulator with a control pulse, wherein there is provided changing means for changing the primary random walk filter, the secondary random walk filter, the counter value of the Q counter and the rate length of the rate multiplier, which cause system parameters of the DPLL to be determined for respective PDH signals according to a switching control signal.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

DETAILED DESCRIPTION OF THE PREFERRED EMBODIMENT

Figure 1:
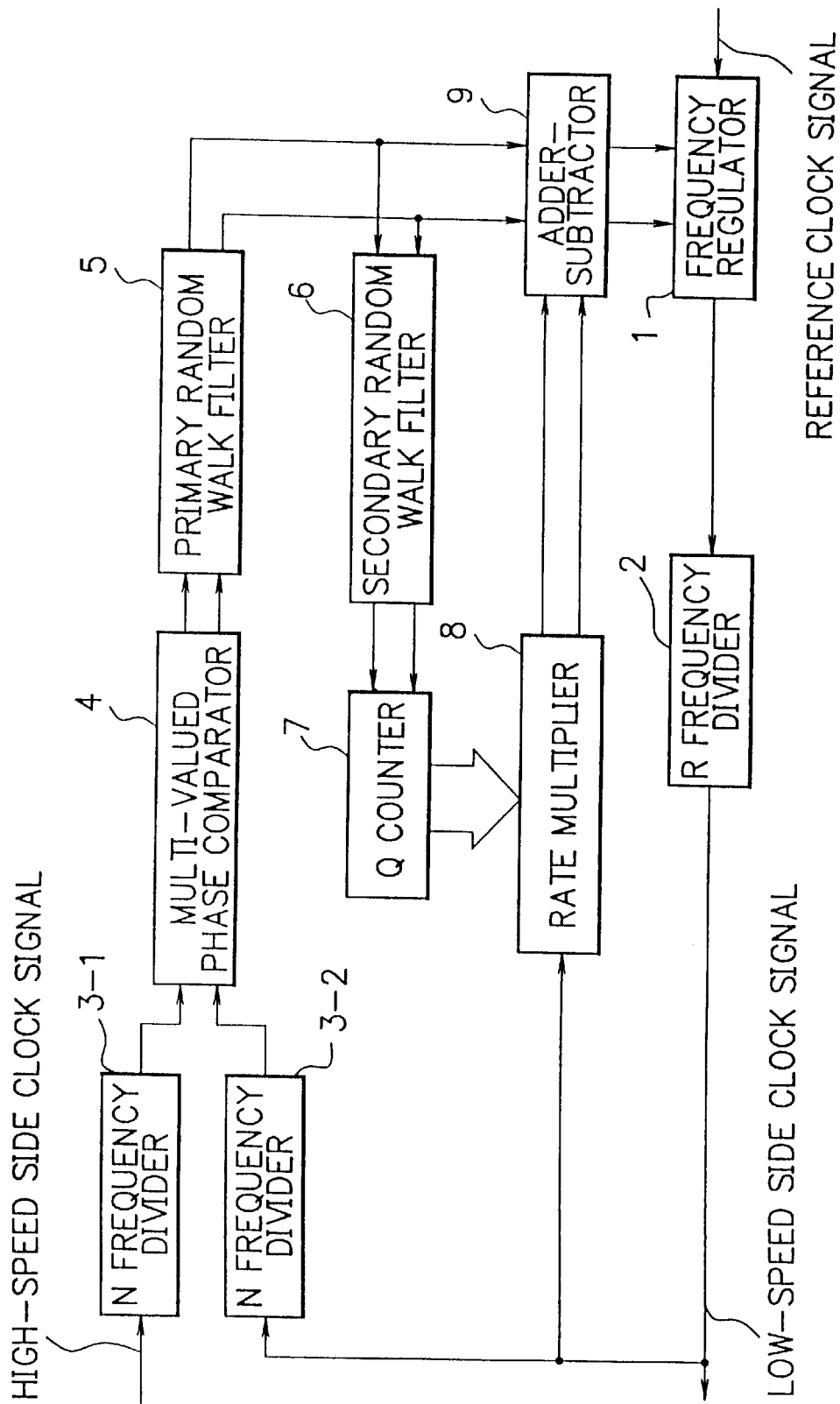
FIG. 1 is a block diagram showing a constitution of a destuff circuit in which conventional complete secondary DPLL system is in use.

A preferred embodiment of the present invention will now be described. The preferred embodiment of the present invention, in a destuff circuit adopting a complete secondary DPLL system, causes a primary random walk filter (5 of FIG. 2), a secondary random walk filter (6 of FIG. 2), and a counter stage number of a Q counter (7 of FIG. 2) to be changed, and further causes the rate length of a rate multiplier (8 of FIG. 2) to be changed according to a switching signal from a selector (10 of FIG. 2), so that a required DPLL (Digital Phase Locked Loop) circuit for a respective PDH (Plesiochronous Digital Hierarchy) low-speed signal interface is provided.

According to the embodiment of the present invention, the counter value which causes system parameters of the DPLL to be determined is capable of being set to respective values of parameters of a 2M-interface and parameters of a 1.5M-interface according to switching by the selector. It is unnecessary to design separately the DPLL circuit applicable to a 2M package or a 1.5M package. The operation of the selector of the invention enables the DPLL circuit to be shared for the 2M-package and for the 1.5M package respectively.

The concrete embodiment of the present invention will be explained referring to the accompanying drawing.

Figure 2:
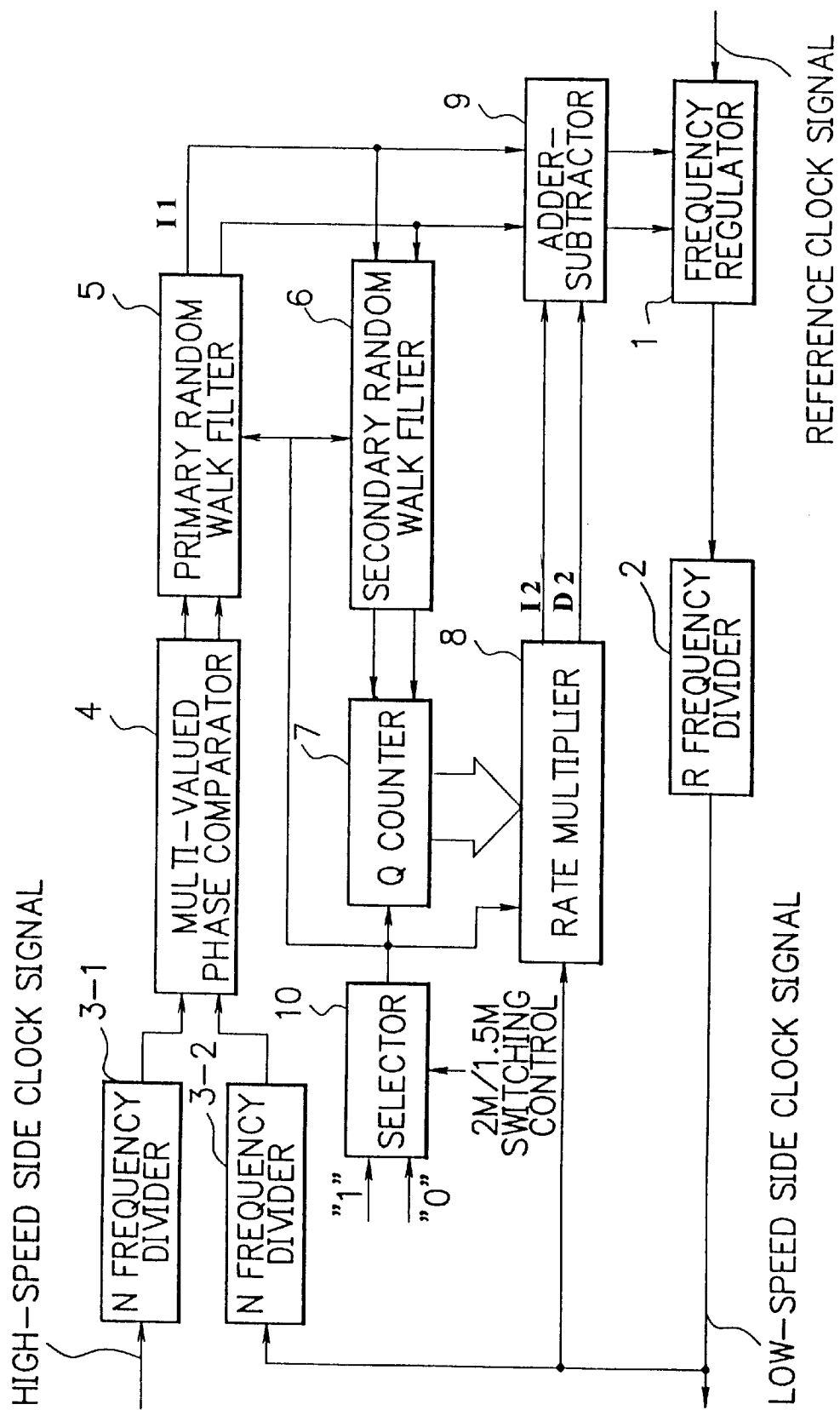
FIG. 2 is a block diagram showing a constitution of PDH low speed signal switching DPLL system according to one embodiment of the present invention.

FIG. 2 is a block diagram showing a destuff circuit in which a complete secondary DPLL (Digital Phase-Locked Loop) system with a detection function of a high speed side clock signal in one embodiment of the present invention.

Referring now to FIG. 2, the destuff circuit of the present embodiment comprises a frequency regulator 1 for regulating a frequency by increasing or decreasing a pulse(s) to or from a reference clock signal, an R frequency divider 2 for dividing by R the frequency of the frequency-regulated reference clock signal to output it as a low-speed side clock signal, N frequency dividers 3-1 and 3-2 for dividing by N the frequencies of a high-speed side clock signal and the low-speed side clock signal, a multi-valued phase comparator 4 for comparing the phases output from the N frequency dividers 3-1 and 3-2 to output a leading phase pulse which represents the number of phase leads accumulating to a phase difference of 180° and a lagging phase pulse which represents the number of phase lags accumulating to a phase difference of 180°, a primary random walk filter 5 for dividing by N1 the difference between the pulse numbers of the leading phase outputs from the multi-valued phase comparator, a secondary random walk filter 6 for dividing by N2 the pulse number outputs from the primary random walk filter 5, a Q counter 7 for storing the output of the secondary random walk filter 6, a rate multiplier 8 for producing some increment pulses or decrement pulses according to the low-speed side clock signal and a central frequency of the system and outputting the increments pulses and decrement pulses according to values stored in the Q counter, an adder-subtractor circuit 9 for increasing or decreasing the output of the primary random walk filter according to the output of the rate multiplier to provide the frequency regulator with a control pulse and a selector 10.

In this circuit, a primary loop is composed of the frequency regulator 1, the R frequency divider 2, the N frequency dividers 3-1 and 3-2, the multi-valued phase comparator 4, the primary random walk filter 5, and adder-subtractor circuit 9. A secondary loop is composed of the secondary random walk filter 6, the Q counter 7, the rate multiplier 8, and the adder-subtractor circuit 9 which is common to the primary loop.

The frequency regulator 1 regulates frequency so as to increase or decrease a pulse(s) to or from a reference clock signal which is an oscillation signal with a predetermined repetition frequency.

The R frequency divider 2 divides by R the reference clock signal which is frequency-regulated to output a low-speed side clock signal.

The N frequency dividers 3-1 and 302 divide by N the frequencies of the high-speed side clock signal and the low-speed side signal.

The multi-valued phase comparator 4 compares phases output of the N frequency dividers 3-1 and 3-2 to output a leading phase pulse which represents the number of phase leads accumulating to a phase difference 180° and a lagging phase pulse which represents the number of phase lags accumulating to a phase difference 180°.

The primary random walk filter 5 is an up-down counter. The primary random walk filter 5 implements an up-count of the pulse number of a leading phase which is an output of the multi-valued phase comparator. The primary random walk filter 5 also implements a down-count of the pulse number of a lagging phase which is an output of the multi-valued phase comparator. The primary random walk filter 5 divides by N1 the difference between the pulse number of the leading pulse and the pulse number of the lagging pulse output from the multi-valued phase comparator 4, thus transmitting a control pulse to the frequency regulator 1 after being further adjusted in the adder-subtractor 9. There are two pulses in regard to the control pulses. One of the control pulses is an increment pulse (which is a pulse represented by a plus in the count value of the primary random walk filter 5), while the other of the control pulses is a decrement pulse (which is a pulse represented by a minus in the count value of the primary random walk filter 5).

The secondary random walk filter 6 is an up-down counter. The secondary random walk filter 6 implements an up-count of the pulse number of a leading phase which is an output of the primary random walk filter 5. The secondary random walk filter 6 also implements a down-count of the pulse number of a lagging phase which is an output of the primary random walk filter 5. The secondary random walk filter 6 divides by N2 the difference between the numbers of the leading pulse and lagging pulse outputs from the primary random walk filter 5.

The Q counter 7 counts and stores the increment pulse number or the decrement pulse number output of the secondary random walk filter 6.

The rate multiplier 8 produces some increment pulses or decrement pulses according to the low-speed side clock signal and stored values. The rate multiplier 8 selects one of a number of increment pulses or decrement pulses according to values stored in the Q counter 7, thus further controlling (in addition to the output of filter 5) the frequency regulator 1 using the increment pulses or decrement pulses as a second increment pulse or decrement pulse corresponding to a central frequency of the system.

The adder-subtractor circuit 9 performs an add-subtract of the increment pulse I1 and the decrement pulse D1 from the primary random walk filter 5, and the increment pulse I2 and the decrement pulse D2 from the rate multiplier 8. Within one prescribed period, (a) when the increment pulse I1 and the increment pulse I2 appear, it causes two increment pulses to be output, (b) when the decrement pulse D1 and the decrement pulse D2 appear, it causes two decrement pulses to be output, (c) when the increment pulse I1 or the increment pulse I2 appears, it causes one increment pulse to be output, (d) when the decrement pulse D1 or the decrement pulse D2 appears, it causes one decrement pulse to be output, or (e) when the increment pulse I1 and the decrement pulse D1, or the increment pulse I1 and the decrement pulse D2, or the increment pulse I2 and the decrement pulse D1, or the increment pulse I2 and the decrement pulse D2 appear, it causes the increment pulse or the decrement pulse not to be output.

Next, operation of the selector 10 will be explained.

In FIG. 2, the selector 10 of the present embodiment sets "1" and "0" by way of an input, when an interface unit is 2M (megahertz), the selector 10 selects "1" to output, while when the interface unit is 1.5M (megahertz), the selector 10 selects "0" to output, according to 2M/1.5M switching signal.

Then, the output signal of the selector 10 is input to the primary random walk filter 5, the secondary random walk filter 6, the Q counter 7, and the rate multiplier 8 respectively. The output signal of the selector causes the counter value of the primary random walk filter 5 to be set to the counter value (N1–1) for 1.5M or the counter value (N1–2) for 2M. The output signal of the selector causes the counter value of the secondary random walk filter 6 to be set to the counter value (N2–1) for 1.5M or the counter value (N2–2) for 2M The output signal of the selector causes the counter value of the Q counter 7 to be set to the counter value (Q–1) for 1.5M or the counter value (Q–2) for 2M. The output signal of the selector causes the rate length of the rate multiplier 8 to be set to the rate length (M–1) for 1.5 M or the rate length (M–2) for 2M.

According to the embodiment described above, the DPLL enables system parameter values of the DPLL for 2M and 1.5M to be possessed respectively. It is unnecessary to design separate DPLL circuits applicable to each of a 2M package and a 1.5M package. It is capable of sharing the circuit for 2M and 1.5M.

In the above-described embodiment, there is explained the cases where the DPLL causes the PDH low speed signal of 2M and 1.5M to be used, however the present invention is not limited by this case, but is applicable to various PDH low speed signals.

As described above, the PDH low speed signal switching DPLL system according to the present invention enables the selector to switch the number of stages of counters of the primary random walk filter (N1-1 or N1-2), the secondary random walk filter (N2-1 or N2-2), and Q counter (Q-1 or Q-2) within the DPLL circuit, or to switch the rate length of the rate multiplier (M-1 or M-2), with the result that it is unnecessary to prepare separately the circuit of respective PDH low speed signal interface units, so that it is capable of cutting developments costs greatly in the case of development of an LSI circuit. There is the effect that it is capable of using the DPLL circuit in common with a plurality of PDH low speed signal interface units.

While particular embodiments illustrative of the invention have been described by way of example, it will be understood that variations and modifications thereof, as well as other embodiments may be conceived within the scope of the following claims.

What is claimed is:

1. A PDH (Plesiochrounous Digital Hierarchy) low speed signal switching DPLL (Digital Phase-Locked Loop) system comprising a destuff circuit using a complete secondary DPLL (Digital Phase-Locked Loop) system comprising a primary loop and a secondary loop, said primary loop comprising:

a frequency regulator for regulating a frequency so as to add or eliminate a pulse to or from a reference clock signal;

an R frequency divider for outputting a low speed side clock signal while dividing said reference clock signal being subjected to frequency regulation by R;

a first and a second N frequency divider for dividing a high speed side clock signal and the low speed side clock signal, respectively, by N;

a multi-valued phase comparator for comparing phase outputs from the first and the second N frequency dividers to output a leading phase pulse which represents a number of phase leads accumulating to a phase difference of 180° and a lagging phase pulse which represents a number of phase lags accumulating to a phase difference 180°;

a primary random walk filter for dividing a difference between pulse numbers of the leading phase and lagging phase output from the multi-valued phase comparator by N1; and an adder-subtractor circuit for providing said frequency regulator with a control pulse, said secondary loop comprising:

a secondary random walk filter for dividing a pulse number output from said primary random walk filter by N2;

a Q counter for storing an output of said secondary random walk filter;

a rate multiplier for producing increment pulses or decrement pulses according to the low speed side clock signal and a central frequency of the system, and in accordance therewith selecting the increment pulses and decrement pulses, and outputting a selected pulse according to a value written in the Q counter; and said adder-subtractor for increasing or decreasing the pulse number output of the primary random walk filter in accordance with the output of the rate multiplier to provide the frequency regulator with the control pulse, wherein said destuff circuit includes a selector which implements changes of counter value of said primary random walk filter, counter value of said secondary random wall filter, counter stage numbers of said Q counter, and a change of rate length of said rate multiplier, pursuant to a signal which implements switching of DPLL parameters for respective PDH signals.

2. A PDH (Plesiochrounous Digital Hierarchy) low speed signal switching DPLL (Digital Phase-Locked Loop) system comprising a destuff circuit using a complete secondary DPLL (Digital Phase-Locked Loop) system comprising a primary loop and a secondary loop, said primary loop comprising:

a frequency regulator for regulating a frequency so as to add or eliminate a pulse to or from a reference clock signal;

an R frequency divider for outputting a low speed side clock signal while dividing said reference clock signal being subjected to frequency regulation by R;

a first and a second N frequency divider for dividing a high speed side clock signal and the low speed side clock signal, respectively, by N;

a multi-valued phase comparator for comparing a phase output from the first and the second N frequency dividers to output a leading phase pulse which represents a number of phase leads accumulating to a phase difference of 180° and a lagging phase pulse which represents a number of phase lags accumulating to a phase difference of 180°;

a primary random walk filter for dividing a difference between pulse numbers of the leading phase and lagging phase output from the multi-valued phase comparator by N1; and an adder-subtractor circuit for providing said frequency regulator with a control pulse, said secondary loop comprising:

a secondary random walk filter for performing an up-count/down-count of an increment pulse/decrement pulse which is a control pulse output from said primary random walk filter to divide a difference of respective count numbers;

a Q counter for counting and storing said increment pulse/decrement pulse which is an output of said secondary random walk filter;

a rate multiplier for producing increment pulses or decrement pulses according to the low speed side clock signal and a central frequency of the system, and in accordance therewith selecting the increment pulses and decrement pulses, and outputting the selected pulse according to a value written in the Q counter; and said adder-subtractor for increasing or decreasing the output of the primary random walk filter in accordance with the output of the rate multiplier to provide the frequency regulator with the control pulse, wherein there is provided a changing means for changing said primary random walk filter, said secondary random walk filter, a counter value of said Q counter and a rate length of said rate multiplier to cause system parameters of said DPLL to be determined according to a switching control signal.

3. A signal switching method of a PDH (Plesiochrounous Digital Hierarchy) low speed signal switching DPLL (Digital Phase-Locked Loop) system comprising a destuff circuit using a complete secondary system DPLL (Digital Phase-Locked Loop) comprising a primary loop and a secondary loop, in said primary loop, said signal switching method comprising the steps of:

regulating a frequency so as to add or eliminate a pulse to or from a reference clock signal by a frequency regulator;

outputting a low speed side clock signal by dividing said reference clock signal being subjected to frequency regulation by R means of an R frequency divider;

dividing a high speed side clock signal and the low speed side clock signal, by N by first and a second N frequency dividers, respectively;

comparing phases output from the first and the second N frequency dividers to output a leading phase pulse which represents a number of phase leads accumulating to a phase difference of 180° and a lagging phase pulse which represents a number of phase lags accumulating to a phase difference of 180° by means of a multi-valued phase comparator;

dividing a difference between pulse numbers of the leading phase pulse and lagging phase pulse output from the multi-valued phase comparator by N1 by a primary random walk filter; and providing said frequency regulator with a control pulse by an adder-subtractor circuit, in said secondary loop, said signal switching method comprising the steps of:

dividing a pulse number output from said primary random walk filter by N2 by a secondary random walk filter;

storing an output of said secondary random walk filter by a Q counter;

producing with a rate multiplier increment pulses or decrement pulses according to the low speed side clock signal and a central frequency of the system, and the rate multiplier outputting a selected pulse according to a value written and stored in the Q counter; and increasing or decreasing the pulse number output of the primary random walk filter in accordance with the output of the rate multiplier to provide the frequency regulator with the control pulse by said adder-subtractor, wherein said destuff circuit includes a selector which implements changes of a counter value of said primary random walk filter, a counter value of said secondary random walk filter, counter stage numbers of said Q counter, and a change of rate length of said rate multiplier, pursuant to a signal which implements switching of DPLL parameters for respective PDH signals.

4. A signal switching method of a PDH (Plesiochrounous Digital Hierarchy) low speed signal switching DPLL (Digital Phase-Locked Loop) system comprising a destuff circuit using a complete secondary DPLL (Digital Phase-Locked Loop) system comprising a primary loop and a secondary loop, in said primary loop, said signal switching method comprising the steps of:

regulating a frequency so as to add or eliminate a pulse to or from a reference clock signal by a frequency regulator;

outputting a low speed side clock signal by dividing said reference clock signal being subjected to frequency regulation by R by an R frequency divider;

dividing a high speed side clock signal and the low speed side clock signal, by N by first and a second N frequency dividers, respectively;

comparing phases output from the first and the second N frequency dividers to output a leading phase pulse which represents the number of phase leads accumulating to a phase difference of 180° and a lagging phase pulse which represents the number of phase lags accumulating to a phase difference of 180° by a multi-valued comparator;

dividing a difference between pulse numbers of the leading phase pulse and lagging phase pulse output from the multi-valued phase comparator by N1 by a primary random walk filter; and providing said frequency regulator with a control pulse by an adder-subtractor circuit, in said secondary loop, a signal switching method comprising the steps of:

performing an up-count/down-count of an increment pulse/decrement pulse which is a control pulse output from said primary random walk filter to divide a difference of respective count numbers by a secondary random walk filter;

counting and storing said increment pulse/decrement pulse which is an output of said secondary random walk filter by a Q counter;

producing increment pulses or decrement pulses according to the low speed side clock signal and a central frequency of the system, and a rate multiplier for outputting the selected pulse according to a value written and stored in the Q counter; and increasing or decreasing the control pulse output of the primary random walk filter and the output of the rate multiplier to provide the frequency regulator with the control pulse by said adder-subtractor, wherein there is provided a changing means for changing said primary random walk filter, said secondary random walk filter, counter value of said Q counter and rate length of said rate multiplier to cause system parameters of said DPLL to be determined according to switching control signal.

* * * * *